(12) United States Patent
Rhee et al.

(10) Patent No.: US 6,211,743 B1
(45) Date of Patent: Apr. 3, 2001

(54) PHASE-LOCKED LOOP HAVING TEMPERATURE-COMPENSATED BANDWIDTH CONTROL

(75) Inventors: Woogeun Rhee, Irvine; Akbar Ali, Garden Grove; Matteo Conta, Irvine, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/314,898

(22) Filed: May 19, 1999

(51) Int. Cl.$^7$ ............................... H03L 1/02; H03L 7/08
(52) U.S. Cl. .................... 331/34; 331/8; 331/17; 331/18; 331/25
(58) Field of Search ................... 331/8, 17, 18, 331/25, 34, 176

(56) References Cited

U.S. PATENT DOCUMENTS

| | | | | |
|---|---|---|---|---|
| 4,717,891 | * | 1/1988 | Ichise | 331/17 |
| 5,426,398 | * | 6/1995 | Kuo | 331/57 |
| 5,963,105 | * | 10/1999 | Nguyen | 331/176 |
| 6,078,634 | * | 6/2000 | Bosshart | 375/376 |

OTHER PUBLICATIONS

"Design of PLL–Based Clock Generation Circuits"; IEEE Journal of Solid–State Circuits, Apr., 1987, pp. 255–261, Deog–Kyoon Jeong et al.

* cited by examiner

Primary Examiner—David Mis
(74) Attorney, Agent, or Firm—Lyon & Lyon LLP

(57) ABSTRACT

A phase-locked loop includes a phase/frequency detector, a charge pump, a loop filter, an oscillator and a feedback circuit coupled between the oscillator and the phase/frequency detector. The loop filter includes a first temperature-variable well resistor and has a gain directly related to resistance of the first resistor. An oscillator coupled to the loop filter includes a voltage-to-current converter that generates a reference current based on the loop filter voltage, and a current-controlled oscillator that generates the output clock based on the value of the reference current. The voltage-to-current converter includes a first transistor that receives the loop filter voltage at a gate and a second temperature-variable well resistor coupled to the source of the first transistor. The oscillator gain is indirectly related to the resistance of the second resistor. The second well resistor and first well resistor have substantially equal resistances and substantially equal temperature coefficients. Since the loop bandwidth includes the product of the loop filter gain and oscillator gain, the effect of temperature-induced resistance variations on loop bandwidth is minimized.

33 Claims, 6 Drawing Sheets

PHASE-LOCKED LOOP HAVING TEMPERATURE-COMPENSATED BANDWIDTH CONTROL

FIELD OF THE INVENTION

The present invention relates generally to phase-locked loops and, more particularly, relates to a phase-locked loop having a loop bandwidth that is compensated for temperature variations.

BACKGROUND OF THE INVENTION

Many electrical and computer applications and components have critical timing requirements that compel generation of periodic clock waveforms that are precisely synchronized with a reference clock waveform. A phase-locked loop ("PLL") is one type of circuit that is widely used to provide an output signal having a precisely controlled frequency that is synchronous with the frequency of a received or input signal. Wireless communication devices, frequency synthesizers, multipliers and dividers, single and multiple clock generators, and clock recovery circuits are but a few examples of the manifold implementations of PLLs.

Frequency synthesis is a particularly common technique used to generate a high frequency clock from a lower frequency reference clock. In microprocessors, for example, an on-chip PLL can multiply the frequency of a low frequency reference (off-chip) clock, typically in the range of 1 to 4 MHz, to generate a high frequency output clock, typically in the range of 10 to over 200 MHz, that is precisely synchronized with the lower frequency reference clock. Another common use of PLLs is recovery of digital data from serial data streams by locking a local clock signal onto the phase and frequency of the data transitions. The local clock signal is then used to clock a flip-flop or latch receiving input from the serial data stream.

FIG. 1 is a block diagram of a typical PLL 10. PLL 10 comprises phase/frequency detector 12, charge pump 14, loop filter 16, oscillator 18 and frequency divider 20. PLL 10 receives a reference clock signal $CLK_{REF}$ having a frequency $F_{REF}$ and generates an output clock signal $CLK_{OUT}$ having a frequency $F_{OUT}$ that is synchronized with the reference clock signal in phase. The output clock frequency may be an integer (N) multiple of the reference frequency; with the parameter N set by frequency divider 20. Hence, for each reference signal period, there are N output signal periods or cycles.

Phase detector 12 receives on its input terminals two clock signals $CLK_{REF}$ and $CLK_{OUT}$* ($CLK_{OUT}$, with its frequency $F_{OUT}$ divided down by frequency divider 20). In a conventional arrangement, detector 12 is a rising edge detector that compares the rising edges of the two clock signals. Based on this comparison, detector 12 generates one of three states. If the phases of the two signals are aligned, the loop is "locked". Neither the UP nor the DOWN signal is asserted and oscillator 18 continues to oscillate at the same frequency. If $CLK_{REF}$ leads $CLK_{OUT}$*, than oscillator 18 is oscillating too slowly and detector 12 outputs an UP signal proportional to the phase difference between $CLK_{REF}$ and $CLK_{OUT}$*. Conversely, if $CLK_{REF}$ lags $CLK_{OUT}$*, than oscillator 18 is oscillating too quickly and detector 12 outputs a DOWN signal proportional to the phase difference between $CLK_{REF}$ and $CLK_{OUT}$*. The UP and DOWN signals typically take the form of pulses having a width or duration corresponding to the timing difference between the rising edges of the reference and output clock signals. They have a complementary relationship such that neither is asserted at the same time and, if one is asserted, the other is not asserted.

Charge pump 14 generates a current $I_{CP}$ that controls the oscillation frequency $F_{OUT}$ of oscillator 18. $I_{CP}$ is dependent on the signal output by phase detector 12. If charge pump 14 receives an UP signal from detector 12, indicating that $CLK_{REF}$ leads $CLK_{OUT}$*, $I_{CP}$ is increased. If charge pump 14 receives a DOWN signal from detector 12, indicating that $CLK_{REF}$ lags $CLK_{OUT}$*, $I_{CP}$ is decreased. If neither an UP nor a DOWN signal is received, indicating that the clock signals are aligned, charge pump 14 does not adjust $I_{CP}$.

Loop filter 16 is positioned between charge pump 14 and oscillator 18. Application of the charge pump output current $I_{CP}$ to loop filter 16 develops a voltage $V_{LF}$ at the output of filter 16. Filter 16 also removes out-of-band, interfering signals. $V_{LF}$ is then applied to oscillator 18 to control the frequency $F_{OUT}$ of the output clock signal. A common configuration for a loop filter in a PLL is a simple single-pole, low-pass filter that can be realized with a single resistor and capacitor.

Oscillator 18 generates an oscillating output signal $CLK_{OUT}$ having a frequency $F_{OUT}$ proportional to the voltage $V_{LF}$ applied to oscillator 18. Conventional oscillators typically oscillate about a specific center frequency and have a relatively narrow frequency range or bandwidth. When $CLK_{REF}$ leads $CLK_{OUT}$*, charge pump 14 increases $I_{CP}$ to develop a greater $V_{LF}$ at the output of loop filter 16 which, in turn, causes oscillator 18 to increase $F_{OUT}$. Conversely, when $CLK_{REF}$ lags $CLK_{OUT}$*, charge pump 14 decreases $I_{CP}$ to develop a lesser $V_{LF}$ at the output of loop filter 16 which, in turn, causes oscillator 18 to decrease $F_{OUT}$. When $CLK_{REF}$ and $CLK_{OUT}$* are aligned, $V_{LF}$ is not adjusted, and $F_{OUT}$ is kept constant. In this state, PLL 10 is in a "locked" condition.

The output clock signal is also looped back through (in some applications) frequency divider 20. The resultant output $CLK_{OUT}$* is provided to phase/frequency detector 12 to facilitate the phase-locked loop operation. Frequency divider 20 divides $F_{OUT}$ by the multiplication factor N to obtain a divided clock. Divider 20 may be implemented using counters, shift registers, or through other methods familiar to those of skill in the art. Thus, PLL 10 compares the reference clock phase to the divided clock phase and eliminates any detected phase difference between the two by adjusting the frequency of the output clock.

In many applications, it is desirable and advantageous to integrate all of the components of a phase-locked loop on a semiconductor chip. On-chip phase-locked loops are often implemented using CMOS technology. Due to the high temperature coefficients displayed by some of the integrated components, however, it is difficult to maintain a constant loop bandwidth over temperature variations. This is especially problematic in digital CMOS, which requires the use of integrated circuitry components having particularly high temperature coefficients, such as well resistors.

In view of the above, there is a need for a phase-locked loop that demonstrates a stable bandwidth in relation to temperature variations.

SUMMARY OF THE INVENTION

In accordance with the purpose of the invention as broadly described herein, there is provided a phase-locked loop that demonstrates a stable and substantially constant bandwidth in relation to temperature variations.

In one embodiment of the present invention, a phase-locked loop includes a phase/frequency detector that compares a reference clock with an output clock and generates an appropriate charge pump control voltage. A charge pump coupled to the phase/frequency detector generates a loop filter control current from the charge pump control voltage. A loop filter coupled to the charge pump applies the loop filter control current to a first temperature-variable resistor to generate a loop filter voltage. An oscillator coupled to the loop filter includes a voltage-to-current converter that receives the loop filter voltage and generates a reference current by applying the loop filter voltage across a second temperature-variable resistor. The oscillator also includes a current-controlled oscillator that generates the output clock based on the value of the reference current. The oscillator has a gain that is inversely related to the resistance of the second resistor. Accordingly, temperature-induced variations of the resistances of the first and second resistors do not substantially affect the loop bandwidth. A feedback circuit is coupled between the oscillator and the phase/frequency detector to provide the output clock signal to the phase/frequency detector.

In another embodiment of the present invention, a phase-locked loop integrated on a single semi-conductor chip is provided. It includes a phase/frequency detector that compares a reference clock with an output clock and generates an appropriate charge pump control voltage. A charge pump coupled to the phase/frequency detector generates a loop filter control current from the charge pump control voltage. A loop filter coupled to the charge pump generates a loop filter voltage from the loop filter control current. The loop filter includes a first well resistor and a first capacitor connected in series, and a second capacitor connected in parallel with the first well resistor and first capacitor. An oscillator coupled to the loop filter includes a voltage-to-current converter that generates a reference current based on the loop filter voltage, and a current-controlled oscillator that generates the output clock based on the value of the reference current. The voltage-to-current converter includes a first transistor that receives the loop filter voltage at a gate and a second well resistor coupled to the source of the first transistor. The second well resistor and first well resistor have substantially equal resistances and temperature coefficients. A feedback circuit coupled between the oscillator and the phase/frequency detector provides the output clock signal to the phase/frequency detector.

The present invention also provides a method for counteracting bandwidth perturbations due to temperature fluctuations. The method comprises the steps of:

(a) providing a phase-locked loop having a first temperature-sensitive element;

(b) obtaining a second temperature-sensitive element; and (c) situating the second temperature-sensitive element in the phase-locked loop to counteract perturbations in the loop bandwidth due to temperature fluctuations. In one implementation, the first and second temperature-sensitive elements are resistors having substantially equal temperature coefficients. One resistor is situated in the loop filter and the other resistor is situated in complementary fashion in the oscillator.

In another method according to the present invention, a substantially constant bandwidth in a phase-locked loop is provided. The method comprises the following steps:

(a) obtaining a first temperature-variable resistor R1;

(b) situating resistor R1 in the phase-locked loop such that a loop filter gain is directly related to R1;

(c) obtaining a second temperature-variable resistor R2; and (d) situating resistor R2 in the phase-locked loop such that an oscillator gain is inversely related to R2. In this method, the bandwidth is expressed as a product of the loop filter gain and the oscillator gain.

Objects and advantages of the present invention include any of the foregoing, singly or in combination. Further objects and advantages will be apparent to those of ordinary skill in the art, or will be set forth in the following disclosure.

BRIEF DESCRIPTION OF THE DRAWINGS

The present invention is described with reference to the accompanying drawings. In the drawings, like reference numbers indicate identical or functionally similar elements.

DETAILED DESCRIPTION OF PREFERRED EMBODIMENTS

Figure 1:
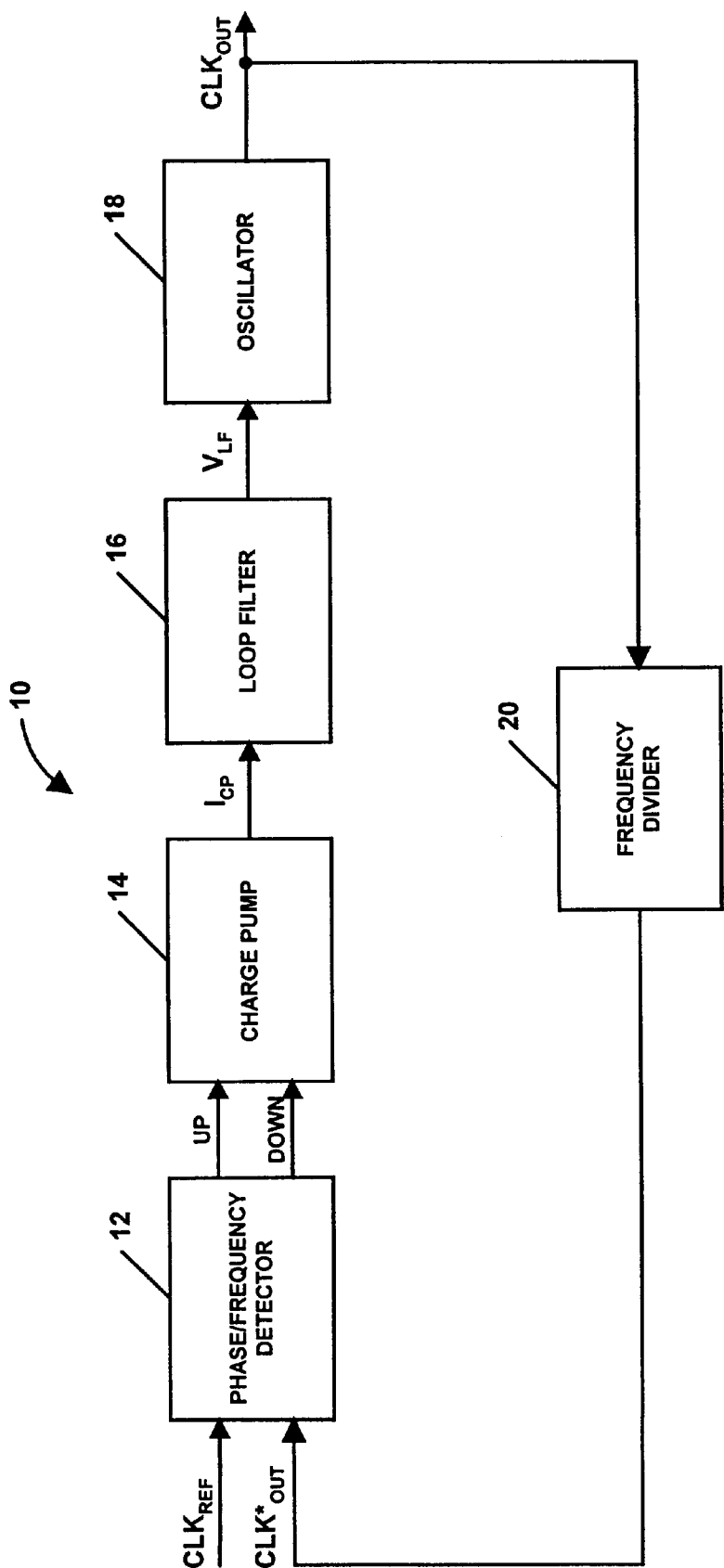
FIG. 1 is a block diagram of a conventional phase-locked loop.
Figure 2:
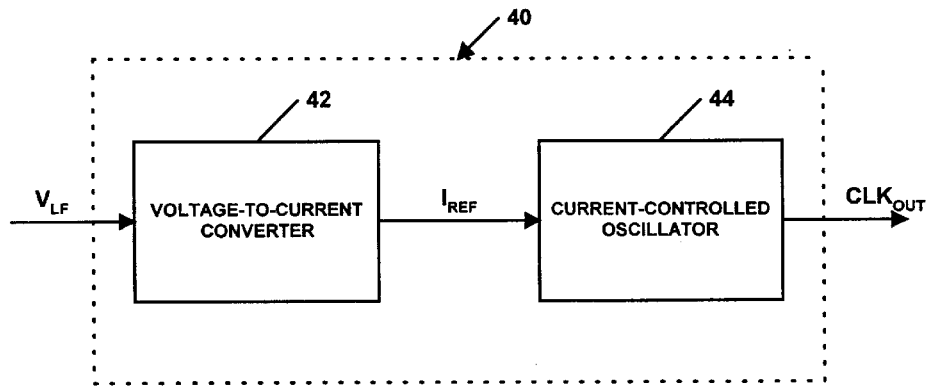
FIG. 2 is a block diagram depicting the components of an oscillator according to the present invention.

The components of a phase-locked loop according to the present invention are illustrated in FIGS. 2–5. FIG. 2 depicts the components of an oscillator 40. Oscillator 40 is implemented in at least two stages: a voltage-to-current converter 42 and a current-controlled oscillator 42. Voltage-to-current converter 42 generates a control current $I_{REF}$ proportional to the value of an input control voltage $V_{LF}$. The voltage $V_{LF}$ is typically generated by a loop filter and has an amplitude representative of necessary adjustments to the output clock frequency. The current $I_{REF}$ is applied to current-controlled oscillator 44, which adjusts the frequency of an output clock signal $CLK_{OUT}$ according to the value of $I_{REF}$.

Figure 3:
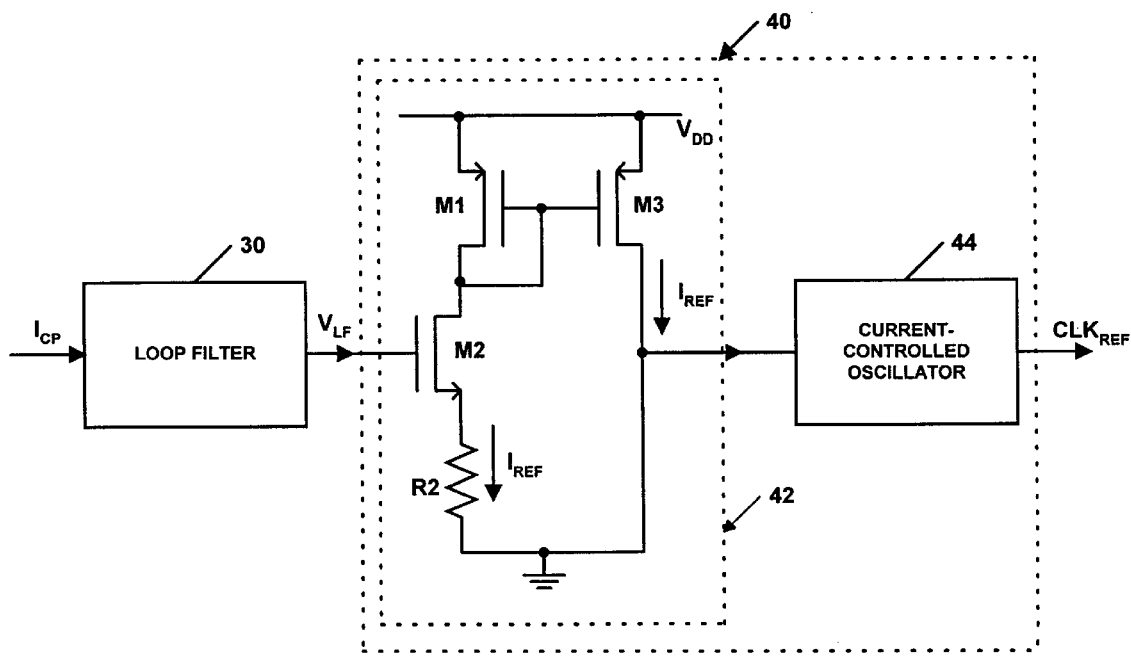
FIG. 3 is a partial block diagram illustrating in schematic detail a voltage-to-current converter according to the present invention.

A circuit implementation of voltage-to-current converter 42 is illustrated in FIG. 3. Voltage-to-current converter 42 generates a control current $I_{REF}$ proportional to the value of control voltage $V_{LF}$ input to the gate of NMOS transistor M2. A resistor R2 is connected in series between the source of transistor M2 and ground. In one implementation example, resistor R2 is an integrated, temperature-variable well resistor having a temperature coefficient of approximately 5000 ppm/° C. Application of the loop filter voltage to the gate of transistor M2 develops a voltage $V_X$ across well resistor R2 that can be expressed as:

$$V_X = V_{LF} - V_{T2};$$

where $V_{T2}$ is the gate-to-source threshold voltage of transistor M2. Hence, a control current $I_{REF}$ is generated that can be expressed as:

$$I_{REF} = \frac{V_X}{R2} = \frac{V_{LF} - V_{T2}}{R2}.$$

The control current $I_{REF}$ is mirrored to current-controlled oscillator 44 through a current mirror implemented by PMOS transistors M1 and M3. The drain of transistor M2 is coupled to the drain of transistor M1 and to the gates of both mirror transistors M1 and M3. The sources of transistors M1 and M3 are coupled to a supply voltage $V_{DD}$. Hence, the control current $I_{REF}$ generated in the M1–M2 branch is mirrored to the M3 branch and supplied to current-controlled oscillator 44.

If appropriate, additional current mirror transistors, as well as cascode transistors, may be implemented between voltage-to-current converter 42 and current-controlled oscillator 44. An implementation with additional current mirrors and a cascoded configuration is set forth in U.S. patent application Ser. No. 09/xxx,xxx, filed on Apr. 30, 1999, which shares a common assignee with the present application. This application is incorporated herein by reference as thought set forth in full. The referenced application also sets forth a circuit implementation of a current-controlled oscillator that would be appropriate for use in conjunction with voltage-to-current converter 42.

Figure 4:
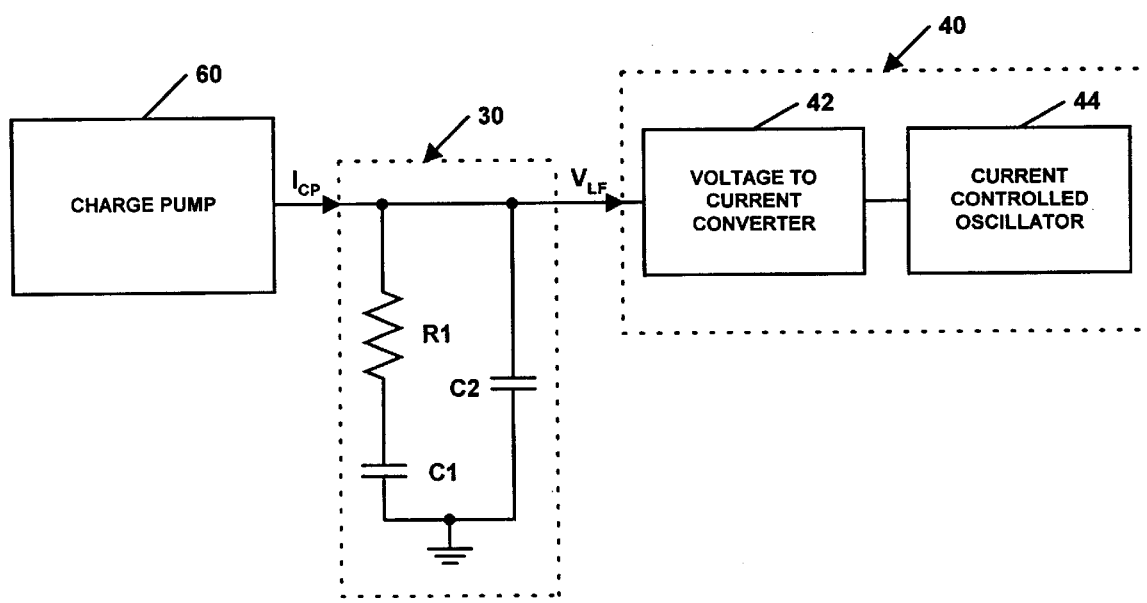
FIG. 4 is a partial block diagram illustrating in schematic detail a loop filter according to the present invention.
Figure 5:
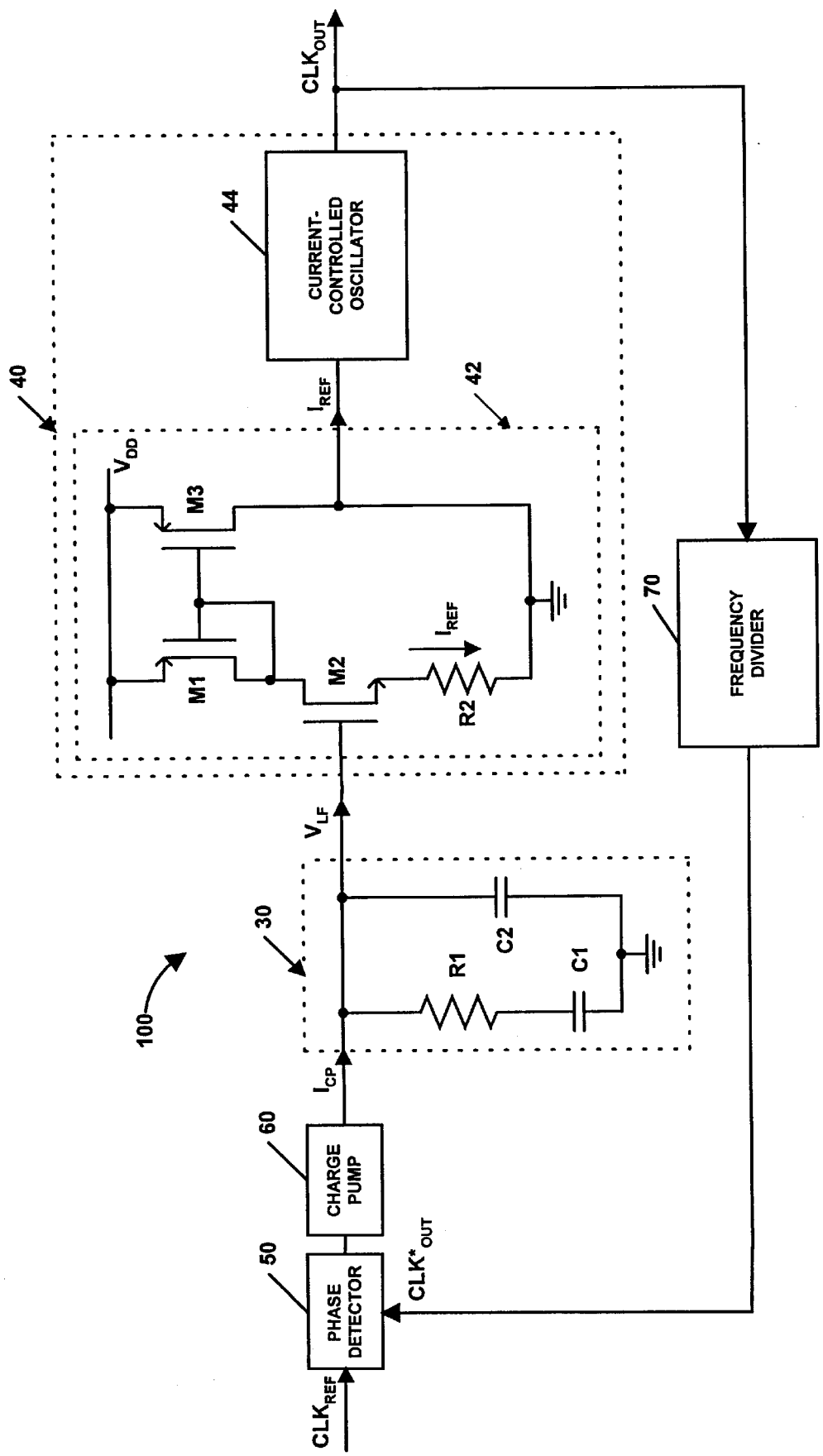
FIG. 5 is a schematic diagram of a phase-locked loop according to the present invention.

A circuit implementation of a loop filter 30 according to the present invention is set forth in FIG. 4. The current $I_{CP}$ output by a charge pump 60 is input to loop filter 30 to generate a voltage $V_{LF}$ that is applied to oscillator 40. Loop filter 30, as shown, consists of a series-connected resistor R1 and capacitor C1 in parallel with a capacitor C2. Capacitors C1 and C2 form an integrating capacitor. If, in response to an UP pulse from a phase detector, $I_{CP}$ is positive, the integrating capacitor is charged and $V_{LF}$ increases by an amount commensurate with the duration of the UP pulse. If, in response to a DOWN pulse, $I_{CP}$ is negative, the integrating capacitor is discharged and $V_{LF}$ decreases by an amount commensurate with the duration of the DOWN pulse. The oscillating frequency is thereby adjusted as necessary to correct for phase differences detected by the phase detector.

In one implementation example, like resistor R2 in oscillator 40, resistor R1 is a temperature-variable, integrated well resistor having a temperature coefficient in the range of 5000 ppm/° C. Moreover, the resistance of resistor R1 is substantially equal to the resistance of resistor R2. As will be set forth in detail below, use of complementary resistors R1 and R2 in oscillator 40 and loop filter 30 having substantially equal temperature coefficients and resistances helps to maintain loop bandwidth stability over temperature variations.

A phase-locked loop 100 implementing loop filter 30 and oscillator 40 as described above is depicted in FIG. 5. In one implementation, phase-locked loop 100 is integrated on a semiconductor chip with CMOS technology. The loop bandwidth BW of PLL 100 can be expressed as:

$$BW = \frac{I_{CP} \cdot R1 \cdot K_{VCO}}{2\pi \cdot N};  \quad \text{(equation 1)}$$

where $I_{CP} \cdot R1$ is the gain of loop filter 30, $K_{VCO}$ is the frequency gain of oscillator 40, and N is the division factor of frequency divider 70. Since, in one implementation example, integrated well resistors R1 and R2 have temperature coefficients of nearly 5000 ppm/° C., their resistances may vary as much as 50% over a 100° C. range. The presence of resistor R1 in equation 1 thus raises the prospect of the loop bandwidth being very dependent on circuit temperature and hence unstable in relation to temperature variations. As the analysis below shows, however, the placement of a complementary well resistor R2 in oscillator 40 has the effect of stabilizing the loop bandwidth.

The gain of oscillator 40 can be expressed as:

$$K_{VCO} = \frac{\Delta F}{\Delta V} = K_{VCC} \cdot K_{CCO}; \quad \text{(equation 2)}$$

where $\Delta F$ is the change in the output frequency of the output clock $CLK_{OUT}$; $\Delta V$ is the change in the control voltage $V_{LF}$; $K_{VCC}$ is the current gain of voltage-to-current converter 42; and $K_{CCO}$ is the frequency gain of current-controlled oscillator 44.

The gain of voltage-to-current converter 42 can be expressed as:

$$K_{VCC} = \frac{\Delta I}{\Delta V} = \frac{1}{R2}; \quad \text{(equation 3)}$$

where $\Delta I$ is the change in the reference current $I_{REF}$ and $\Delta V$ is the change in the control voltage $V_{LF}$. Substituting equations 2 and 3 into equation 1, it follows that the loop bandwidth can be expressed as:

$$BW = \frac{I_{CP} \cdot R1 \cdot \frac{1}{R2} \cdot K_{CCO}}{2\pi \cdot N}.$$

Since resistors R1 and R2 have substantially equal temperature coefficients, variations in their resistances due to temperature fluctuations will also be substantially the same. Fluctuations in loop bandwidth due to temperature fluctuations, therefore, will be minimized. A decrease in the oscillator gain due to a temperature-induced increase in the resistance of R2, for example, will be substantially if not wholly compensated for by an increase in the loop filter voltage due to a corresponding temperature-induced increase in the resistance of R1 (and vice-versa). Loop stability is maximized when resistors R1 and R2 have substantially equal resistances.

Figure 6A:
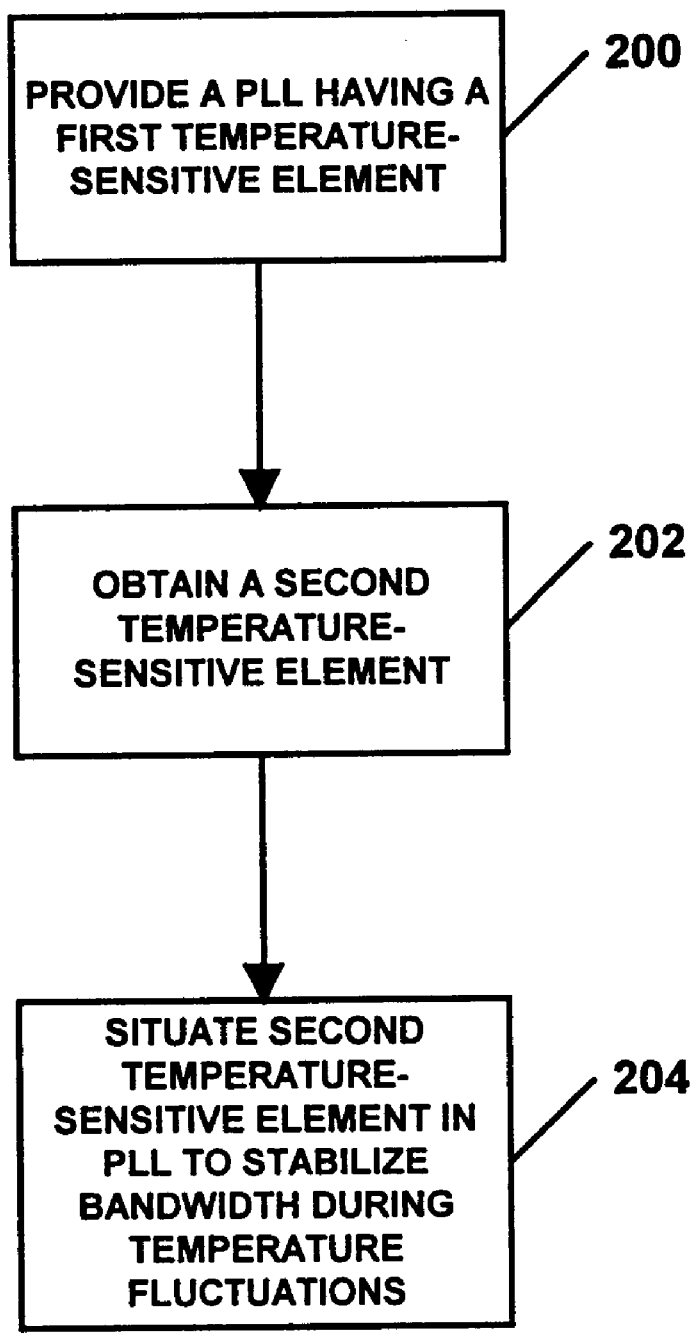
FIG. 6a is a flowchart illustrating one method for providing a substantially constant bandwidth in a phase-locked loop according to the present invention.

FIG. 6a broadly depicts a method for counteracting perturbations in the loop bandwidth of a phase-locked loop due to temperature fluctuations. In step 200, a PLL having a first temperature sensitive element is provided. In one implementation, the temperature sensitive element is a resistor and is placed in one of the loop filter or the oscillator. In step 202, a second temperature-sensitive element is obtained. Again, in one implementation, the second temperature-sensitive element is a resistor. In this implementation, the first and second resistors are integrated well resistors having a temperature coefficient of approximately 5000 ppm/° C. In step 204, the second temperature-sensitive element is situated in the PLL to stabilize the loop bandwidth during temperature fluctuations. That is, it is situated to substantially counteract perturbations in the loop bandwidth due to temperature fluctuations. In one implementation, the second temperature element is placed in the other of the loop filter and the oscillator in a complementary relationship to the first temperature-sensitive element.

Figure 6B:
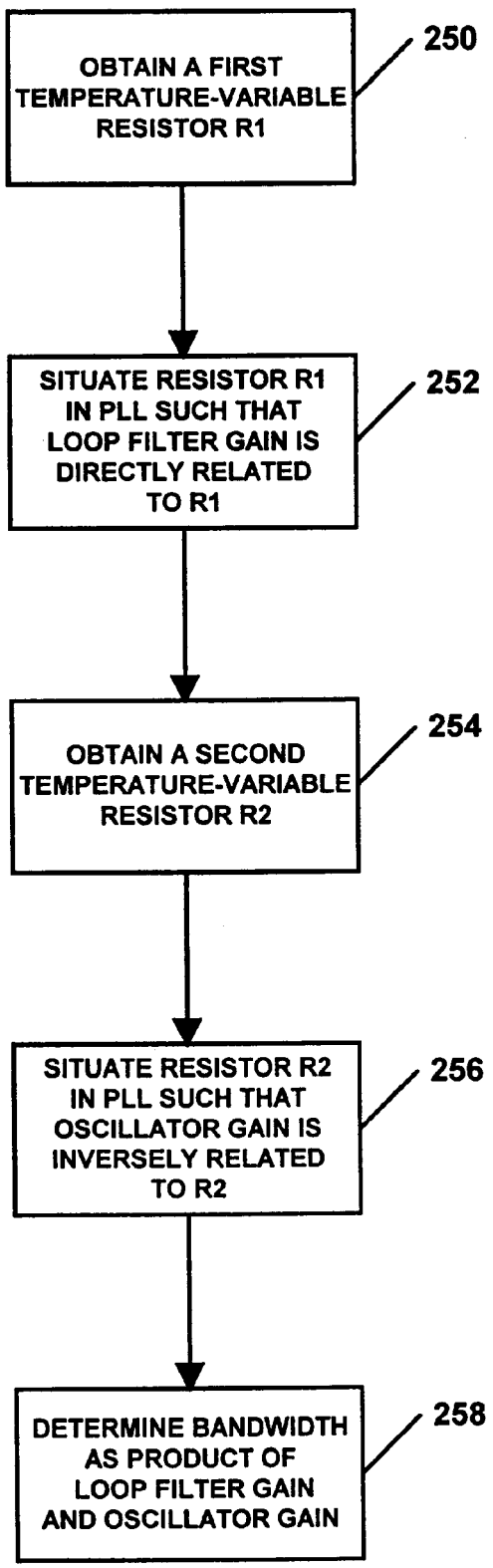
FIG. 6b is a flowchart illustrating another method for providing a substantially constant bandwidth in a phase-locked loop according to the present invention.

FIG. 6b depicts another method for providing a substantially constant loop bandwidth in a PLL. In step 250, a first temperature-variable resistor R1 is obtained. In one implementation, R1 is an integrated well resistor having a temperature coefficient of approximately 5000 ppm/° C. In step 252, R1 is situated in the loop filter such that the loop filter gain is directly related to the resistance of R1 ($I_{CP}$·R1). A second temperature-variable resistor R2 is obtained in step 254. Again, in one implementation, R2 is an integrated well resistor having a temperature coefficient of approximately 5000 ppm/° C. For best results, the resistances of resistors R1 and R2 are substantially equal. In step 256, R2 is situated in the oscillator such that the oscillator gain is inversely related to the resistance of R2

$$\left(K_{VCO} = K_{VCC} \cdot K_{CCO} = \frac{K_{CCO}}{R2}\right).$$

Finally, in step 258, the loop bandwidth is determined as a product of the loop filter gain and the oscillator gain. In this manner, temperature-induced variations in the resistances of R1 and R2 are effectively offset. In particular, the loop bandwidth is expressed as:

$$BW = \frac{I_{CP} \cdot R1 \cdot \frac{1}{R2} \cdot K_{CCO}}{2\pi \cdot N}.$$

While particular embodiments of the present invention have been described above, it should be understood that they have been presented by way of example only, and not as limitations. The breadth and scope of the present invention is defined by the following claims and their equivalents, and is not limited by the particular embodiments described herein.

What is claimed is:

1. A phase-locked loop comprising:
   a phase/frequency detector that compares a reference clock with an output clock and generates an appropriate charge pump control voltage;
   a charge pump coupled to the phase/frequency detector that generates a loop filter control current from the charge pump control voltage;
   a loop filter coupled to the charge pump that applies the loop filter control current to a first temperature-variable resistor to generate a loop filter voltage; wherein the loop filter has a gain that is directly related to the resistance of the first resistor;
   an oscillator coupled to the loop filter comprising a voltage-to-current converter that receives the loop filter voltage and generates a reference current by applying the loop filter voltage to a second temperature-variable resistor, and a current-controlled oscillator that generates the output clock based on the value of the reference current; wherein the oscillator has a gain that is inversely related to the resistance of the second resistor, such that temperature-induced variations of the resistances of the first and second resistors do not substantially affect the loop bandwidth; and
   a feedback circuit coupled between the oscillator and the phase/frequency detector that provides the output clock signal to the phase/frequency detector.

2. A phase-locked loop as claimed in claim 1, wherein the first and second resistors are integrated well resistors having a temperature coefficient of approximately 5000 ppm/° C.

3. A phase-locked loop as claimed in claim 1, wherein the resistances of the first and second resistors are substantially equal.

4. A phase-locked loop as claimed in claim 1, wherein the phase-locked loop is integrated on a single semiconductor chip with CMOS components.

5. A phase-locked loop as claimed in claim 1, wherein the loop filter further comprises a first capacitor connected in series with the first resistor, and a second capacitor connected in parallel with the first capacitor and first resistor.

6. A phase-locked loop as claimed in claim 1, wherein the voltage-to-current converter further comprises an NMOS transistor that receives the loop filter voltage at its gate, and wherein the second resistor is connected to the source of the NMOS transistor.

7. A phase-locked loop as claimed in claim 6, wherein the voltage-to-current converter further comprises a current mirror that mirrors the reference current from the NMOS transistor and the second resistor to the current-controlled oscillator.

8. A phase-locked loop as claimed in 7, wherein the current mirror comprises a pair of PMOS transistors, and wherein the gates of the PMOS transistors are coupled to the drain of the NMOS transistor and the sources of the PMOS transistors are coupled to a supply voltage.

9. A phase-locked loop as claimed in claim 1, wherein the loop bandwidth is expressed as $$BW = \frac{I_{CP} \cdot R1 \cdot \frac{1}{R2} \cdot K_{CCO}}{2\pi \cdot N}.$$

10. A phase-locked loop integrated on a single semiconductor chip and comprising:
    a phase/frequency detector that compares a reference clock with an output clock and generates an appropriate charge pump control voltage;
    a charge pump coupled to the phase/frequency detector that generates a loop filter control current from the charge pump control voltage;
    a loop filter coupled to the charge pump that generates a loop filter voltage from the loop filter control current, the loop filter comprising a first well resistor and a first capacitor connected in series, and a second capacitor connected in parallel with the first well resistor and first capacitor;
    an oscillator coupled to the loop filter comprising a voltage-to-current converter that generates a reference current based on the loop filter voltage, and a current-controlled oscillator that generates the output clock based on the value of the reference current; wherein the voltage-to-current converter comprises a first transistor that receives the loop filter voltage at a gate and a second well resistor coupled to the source of the first transistor, the second well resistor and first well resistor having substantially equal resistances and temperature coefficients; and
    a feedback circuit coupled between the oscillator and the phase/frequency detector that provides the output clock signal to the phase/frequency detector.

11. A phase-locked loop as claimed in claim 10, wherein the temperature coefficient of the first and second well resistors is approximately 5000 ppm/° C.

12. A phase-locked loop as claimed in claim 10, wherein the first transistor is an NMOS transistor.

13. A phase-locked loop as claimed in claim 12, wherein the voltage-to-current converter further comprises a current mirror that mirrors the reference current from the first transistor and the second well resistor to the current-controlled oscillator.

14. A phase-locked loop as claimed in 13, wherein the current mirror comprises a pair of PMOS transistors, and wherein the gates of the PMOS transistors are coupled to the drain of the first transistor and the sources of the PMOS transistors are coupled to a supply voltage.

15. A phase-locked loop as claimed in claim 10, wherein the loop bandwidth is expressed as $$BW = \frac{I_{CP} \cdot R1 \cdot \frac{1}{R2} \cdot K_{CCO}}{2\pi \cdot N}.$$

16. A method for counteracting bandwidth perturbations due to temperature fluctuations comprising the following steps:
   (a) providing a phase-locked loop having a first temperature-sensitive element;
   (b) obtaining a second temperature-sensitive element; and
   (c) situating the second temperature-sensitive element in the phase-locked loop to counteract perturbations in the loop bandwidth due to temperature fluctuations.

17. A method as claimed in claim 16, wherein the first temperature-sensitive element is situated in one of a loop filter or an oscillator.

18. A method as claimed in claim 17, wherein the first temperature-sensitive element is a resistor.

19. A method as claimed in claim 18, wherein the first temperature-sensitive element is an integrated well resistor having a temperature coefficient of approximately 5000 ppm/° C.

20. A method as claimed in claim 17, wherein the second temperature-sensitive element is situated in the other of the loop filter or the oscillator.

21. A method as claimed in claim 20, wherein the second temperature-sensitive element is a resistor.

22. A method as claimed in claim 21, wherein the second temperature-sensitive element is an integrated well resistor having a temperature coefficient of approximately 5000 ppm/° C.

23. A method as claimed in claim 20, wherein the first and second temperature-sensitive elements are resistors having substantially equal temperature coefficients.

24. A method as claimed in claim 23, wherein the first and second temperature-sensitive elements are integrated well resistors having temperature coefficients of approximately 5000 ppm/° C.

25. A method as claimed in claim 24, wherein the first and second resistors have substantially equal resistances.

26. A method for providing a substantially constant bandwidth in a phase-locked loop having a loop filter and an oscillator, the method comprising the following steps:
   (a) obtaining a first temperature-variable resistor R1;
   (b) situating resistor R1 in the phase-locked loop such that the gain of the loop filter is directly related to R1;
   (c) obtaining a second temperature-variable resistor R2; and
   (d) situating resistor R2 in the phase-locked loop such that the gain of the oscillator is inversely related to R2, wherein the bandwidth is a product of the loop filter gain and the oscillator gain.

27. A method as claimed in claim 26, wherein resistors R1 and R2 have substantially equal temperature coefficients.

28. A method as claimed in claim 27, wherein resistors R1 and R2 are integrated well resistors having temperature coefficients of approximately 5000 ppm/° C.

29. A method as claimed in claim 27, wherein resistors R1 and R2 have substantially equal resistances.

30. A method as claimed in claim 26, wherein the loop filter gain is a product of a charge pump output current and the resistance of the first resistor ($I_{CP} \cdot R1$).

31. A method as claimed in claim 30, wherein the oscillator gain is a product of a voltage-to-current converter gain and a current-controlled oscillator gain ($K_{VCC} \cdot K_{CCO}$).

32. A method as claimed in claim 31, wherein the voltage-to-current converter gain is inversely related to the resistance of the second resistor $$\left( K_{VCC} = \frac{1}{R2} \right).$$

33. A method as claimed in claim 32, wherein the bandwidth of the phase-locked loop is expressed as $$BW = \frac{I_{CP} \cdot R1 \cdot \frac{1}{R2} \cdot K_{CCO}}{2\pi \cdot N}.$$

* * * * *